United States Patent [19]
Park et al.

[11] Patent Number: 6,111,063
[45] Date of Patent: *Aug. 29, 2000

[54] ELECTROLUMINESCENT DISPLAY

[75] Inventors: Jong-wook Park, Suwon; Seong-woo Cho, Seongnam, both of Rep. of Korea

[73] Assignee: Samsung Display Devices Co., Ltd., Kyungki-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/037,013

[22] Filed: Mar. 9, 1998

[30] Foreign Application Priority Data

Jul. 23, 1997 [KR] Rep. of Korea .................... 97-34593

[51] Int. Cl.[7] .................... C08G 73/06; B32B 19/00; B32B 9/00
[52] U.S. Cl. .................... 528/423; 528/422; 428/690; 428/691; 428/917; 313/504
[58] Field of Search .................... 528/423, 422; 428/690, 691, 917; 313/504

[56] References Cited

U.S. PATENT DOCUMENTS 5,821,002  10/1998  Ohnishi et al. .................... 428/690

OTHER PUBLICATIONS

Chen Abstract: 126 178642 "New type electroluminescent polymers based on carbazole derivatives" "Park et al."
Park et al., "Synthesis And Electroluminescence Property Of Poly (3,6–N–2–ethyl hexyl carbazolyl vinylene)", pp. 259–260.

*Primary Examiner*—Duc Truong
*Attorney, Agent, or Firm*—Leydig, Voit & Mayer

[57] ABSTRACT

A photoluminescence polymer having a repeating unit in which an aromatic amine and a double bond are conjugated. The photoluminescence polymer can be used as an emission material for the display device, which is particularly useful in a display device requiring an film forming property. Also, a device having the photoluminescence polymer has a low driving voltage and a short response time, and can display various colors over a range from blue to green, especially, blue.

10 Claims, 3 Drawing Sheets

ELECTROLUMINESCENT DISPLAY

BACKGROUND OF THE INVENTION

1. Field of the Invention

The present invention relates to a photoluminescence polymer and a display device adopting the photoluminescence polymer as a color developing substance, and more particularly, to a photoluminescence polymer in which an electron donor component is continuously conjugated, and a display device using the polymer as a color-developing substance.

2. Description of the Related Art

Recent advances in the information and communications industries have increased the need for high performance display devices. Generally, display devices are classified into luminous types and non-luminous types. Luminous type display devices include cathode ray tubes (CRT), electro-luminescence displays (ELD) and light emitting diodes (LED); non-luminous type display devices include liquid crystal displays (LCD).

Indexes of basic performance of display devices operating voltage, power consumption, luminance, contrast, response time, life span and display color, among others.

The LCD, as one of the non-luminous type display devices, has been most favored recently, due to its light weight and low power consumption. However, characteristics such as response time, contrast and viewing angle properties are unsatisfactory, leaving room for improvement. Meanwhile, the ELD has been focused as a next generation display device which can solve such problems.

The ELD, as one of the luminous type display devices, can be manufactured easily and requires a low driving voltage. In addition, the ELD can be made thin and mass-produced.

A color-developing substance used in the ELD includes an inorganic material and an organic material.

The inorganic material consumes more power, and emits yellow range color, so that an additional complicated process is required to display a full range of colors.

On the other hand, it is anticipated that the organic material can overcome the limitations of the inorganic material. As the organic material, poly(p-phenylenevinylene) (PPV) is known. However, such a compound includes a non-conjugated spacer group such as alkyl and ethylene oxide between photoluminescence groups, so that the threshold voltage is relatively high. When the threshold voltage is high, the photoluminescence polymer can be damaged, and it is difficult to drive the ELD adopting the photoluminescence polymer.

On the other hand, it is anticipated that the organic material can overcome the limitations of the inorganic material. However, there has been no organic material to provide colors from blue to green.

SUMMARY OF THE INVENTION

To solve the above problems, it is an object of the present invention to provide a photoluminescence polymer which is capable of producing various colors from blue to green, especially, blue.

It is another object of the present invention to provide a display device having rapid response time, and capable of emitting various colors from blue to green, especially, blue, by using the photoluminescence polymer as a color-developing substance.

To achieve the first object of the present invention, there is provided a photoluminescence polymer having a repeating unit in which an aromatic amine and a double bond are conjugated.

To achieve the second object of the present invention, there is provided a display device which adopts the photoluminescence polymer as a color-developing substance. According to the preferred aspect of the present invention, there is provided a electro-luminescence display (ELD) which adopts the photoluminescence polymer as a color-developing substance.

That is, to achieve the second object, there is also provided a electro-luminescence display (ELD) comprising:

a substrate;

a first electrode layer formed on the substrate;

an emission layer formed on the first electrode layer; and a second electrode layer formed on the emission layer, wherein the emission layer is formed of an photoluminescence polymer having a repeating unit in which an aromatic amine and a double bond are conjugated.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
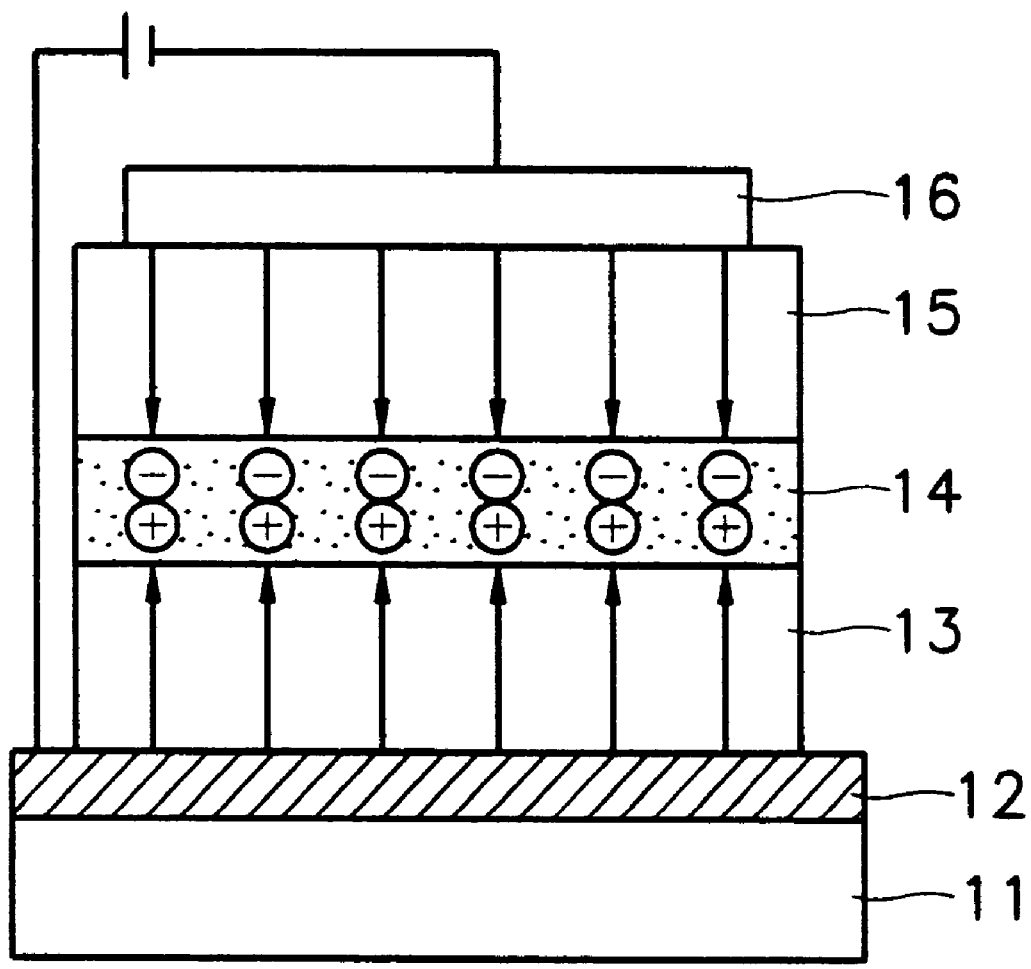
FIG. 1 is a diagram showing the structure of a general organic electro-luminescent display (ELD)

A photoluminescence polymer according to the present invention has a polymer backbone in which an aromatic amine component and double bonds as an electron donor are conjugated. By properly controlling the molecular weight of the photoluminescence polymer, the difference in energy between a ground state and an excited state is controlled to within a desired range, producing an intended luminous color, particularly, blue.

As an example of the photoluminescence polymer, there is the compound represented by the following formula (A):

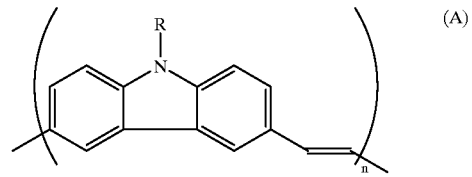

where R is one selected from the group consisting of hydrogen, an unsubstituted or substituted aliphatic hydrocarbon group and an unsubstituted or substituted aromatic hydrocarbon group, and n is an integer between 3 and 260.

Preferably, the weight average molecular weight of the photoluminescence polymer is 500~50,000.

Referring to the following reaction scheme, a synthesis method for the photoluminescence polymer having the structure (A) according to the present invention will be described.

First, 3,6-dibromocarbazole (1) and alkylhalide (2) are reacted with one base selected from the group consisting of potassium carbonate ($K_2CO_3$), sodium carbonate ($Na_2CO_3$), sodium hydride (NaH), sodium hydroxide (NaOH) and potassium hydroxide (KOH) in a solvent selected from the group consisting of dimethylformamide and a mixture of 1,4-dioxane and tetrahydrofuran. After the reaction is completed, N-alkyldibromocarbosole (3) is obtained through a work-up process. Here, when using sodium hydroxide or potassium hydroxide as a base, it is preferable to use water in the same weight as the base, and a phase transfer catalyst such as benzyltrimethylammonium chloride ($C_6H_5CH_2N^+(CH_3)_3Cl^-$).

N-alkyldibromocarbozole (3) is reacted with 1,2-bis(tributylstannyl)ethylene (4), tetra(triphenylphosphine)palladium}{$Pd(PPh_3)_4$} (5), and lithium chloride (LiCl)/N-methylpyrrolidone to obtain poly(3,6-N-alkylcabozoylvinylene) having the formula (A).

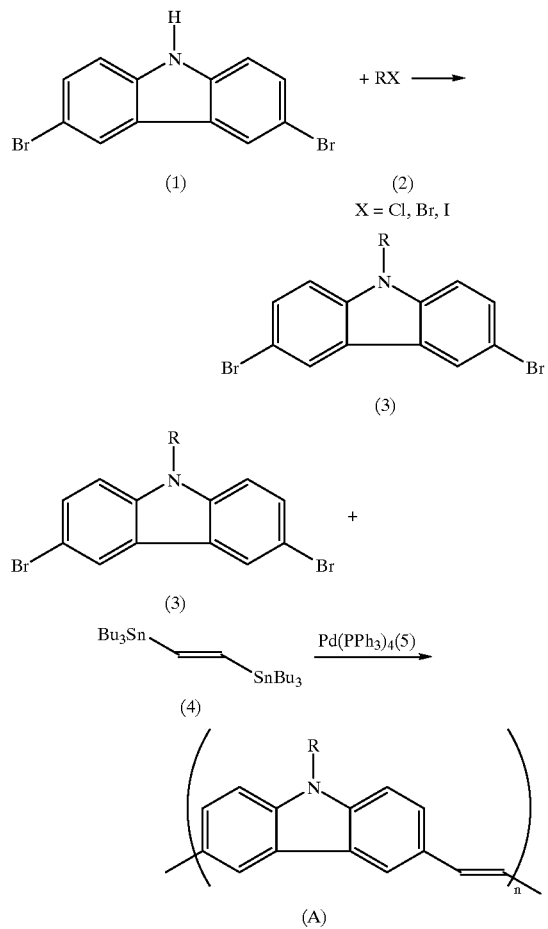

where R and n are the same as defined above.

FIG. 1 is a schematic view of showing the structure of a general organic electro-luminescence display (ELD).

Referring to FIG. 1, a front electrode layer 12 is formed on a substrate 11. On the front electrode layer 12, a hole transport layer 13, an emission layer 14, an electron transport layer 15 and a rear electrode layer 16 are stacked in sequence. Here, the hole transport layer 13, the emission layer 14 and the electron transport layer 15, but not the front electrode layer 12 or the rear electrode layer 16, are all organic thin layers. Among such organic thin layers, the emission layer 14 is formed of the photoluminescence polymer according to the present invention.

In the above ELD, if a voltage is applied to the electrode, an electric field is formed. As a result, the emission layer 14 emits light, thus forming an image.

The front electrode layer 12 is formed of a material having a high value of work function and good transparency, which is one selected from the group consisting of indium tin oxide (ITO), copper (Cu) and gold (Au), and the rear electrode layer 16 is formed of one selected from the group consisting of aluminum (Al), copper (Cu), silver (Ag), calcium (Ca), indium (In) and gold (Au).

Hereinafter, the present invention will be described in detail by the following examples. However, the present invention is not limited to the following examples.

SYNTHESIS EXAMPLE 1

Synthesis of 3,6-dibromo-N-(2-ethylhexyl)carbazole 4.0 ml (22.38 mmol) of 2-ethylhexyl bromide were added to a mixture including 50 ml of anhydrous dimethylformamide (DMF), 4.850 g (14.92 mmol) of 3,6-dibromocarbazole and 4.120 g(29.84 mmol) of potassium carbonate, at room temperature.

After refluxing the reaction mixture for 68 hours, the reaction mixture was poured into 200 ml of ice water. Then, extraction was performed using diethyl ether (150 ml×2).

The collected diethyl ether layer was washed with brine (100 ml×2), and then dried using anhydrous magnesium sulfate ($MgSO_4$). Then, the resultant product was filtered and then concentrated.

A silicagel chromatography was performed using petroleum ether and diethyl ether at a volume ratio of 10:1, to obtain 6.640 g of 3,6-dibromo-N-(2-ethylhexyl)carbazole in yellow oil form (92% yield).

IR(KBr, cm$^{-1}$): 1337(C-N), 748, 723(C-H); $^1$H-NMR (200 MHz, CDCl$_3$) δppm: 0.81–0.92(m, 6H, 2-CH$_3$), 1.20–1.42(m, 8H, 4-CH$_2$), 2.05(m, 1H, —CH—), 4.12(d, 2H, —NCH$_2$—), 7.2–8.1(m, 6H, carbazole aromatic H)

SYNTHESIS EXAMPLE 2

Synthesis of poly(3,6-dibromo-N-2-ethylhexylcarbazoylvinylidene)

A mixture containing 1.250 g (2.60 mmol) of 3,6-dibromo-N-(2-ethylhexyl)carbazole prepared according to Example 1, 90 mg (0.078 mmol) of Pd(PPh$_3$)$_4$ and 26 ml of LiCl (1.0M solution in N-methylpyrrolidone) was heated to 105° C. under an argon (Ar) atmosphere. Then, 1.1 ml (2.60 mmol) of 1,2-bis(tributylstannyl)ethylene was rapidly added to the resultant. Then, the reaction mixture, having a dark color, was heated at 105° C. for 14 hours under an Ar atmosphere.

After cooling the reaction mixture to room temperature, excess methanol was added to form a precipitate. Then, the precipitate was filtered and then dissolved for reprecipitation. The obtained re-precipitate was dried in a vacuum, resulting in poly(3,6-dibromo-N-2-ethylhexylcarbazoylvinylidene)(80% yield). Here, the structure of the compound was observed by using $^1$H-NMR, $^{13}$C-NMR, FT-IR and UV-VIS spectroscopy.

EXAMPLE

An emission layer was formed from the polymer obtained according to Synthesis Example 2, using an ITO electrode and an Al electrode, completing an ELD. Here, the thickness of the emission layer was approximately 1,000 Å.

COMPARATIVE EXAMPLE

An ELD was manufactured by the same method as that of the Example, except that poly(p-phenylenevinylene) was used to form the emission layer.

An electric field was applied to the ELDs manufactured by the Example and the Comparative Example, to measure the characteristics of the devices.

Figure 2:
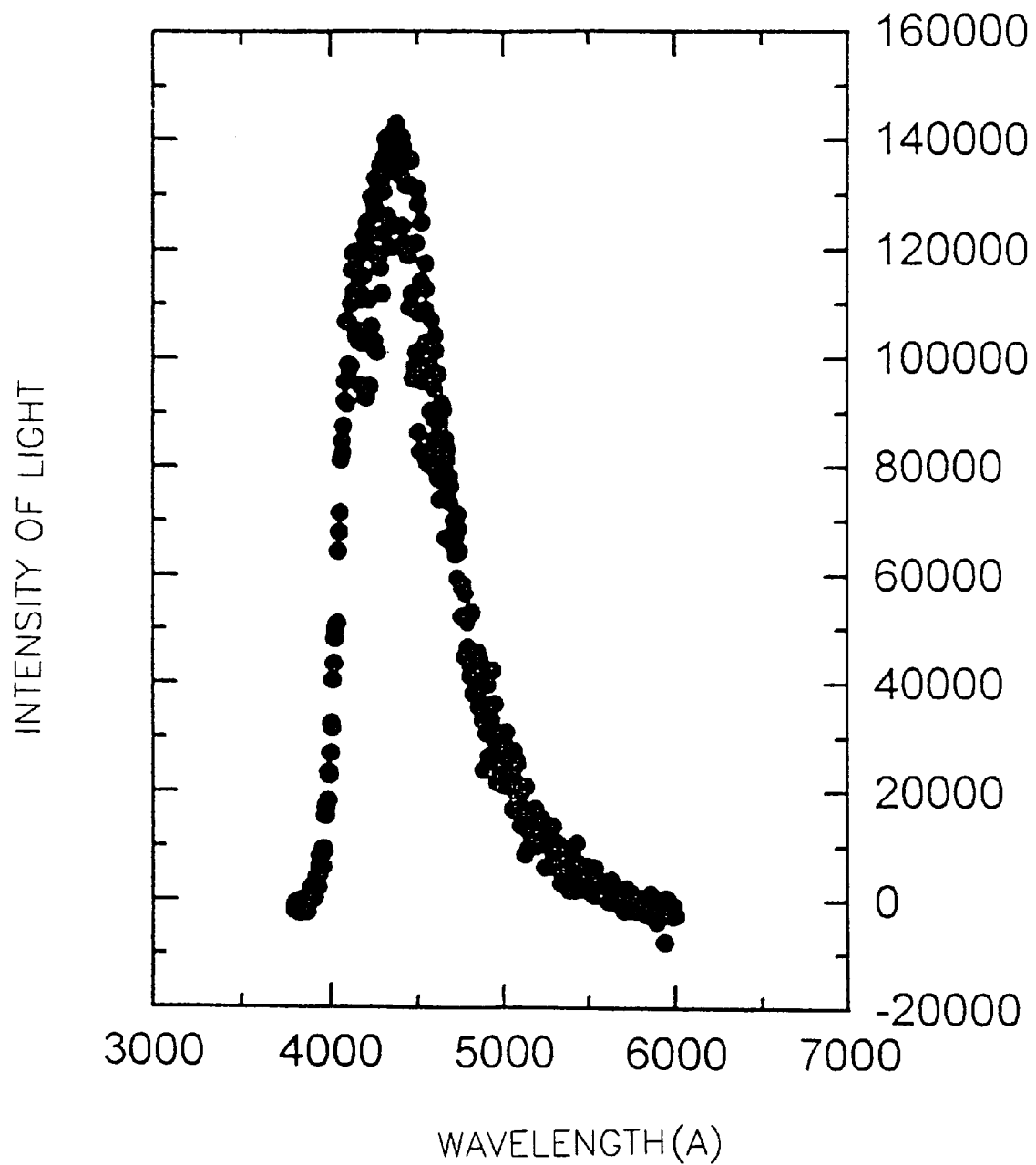
FIG. 2 is a photoluminance (PL) spectrum of a photoluminescence polymer according to a preferred embodiment of the present invention.
Figure 3:
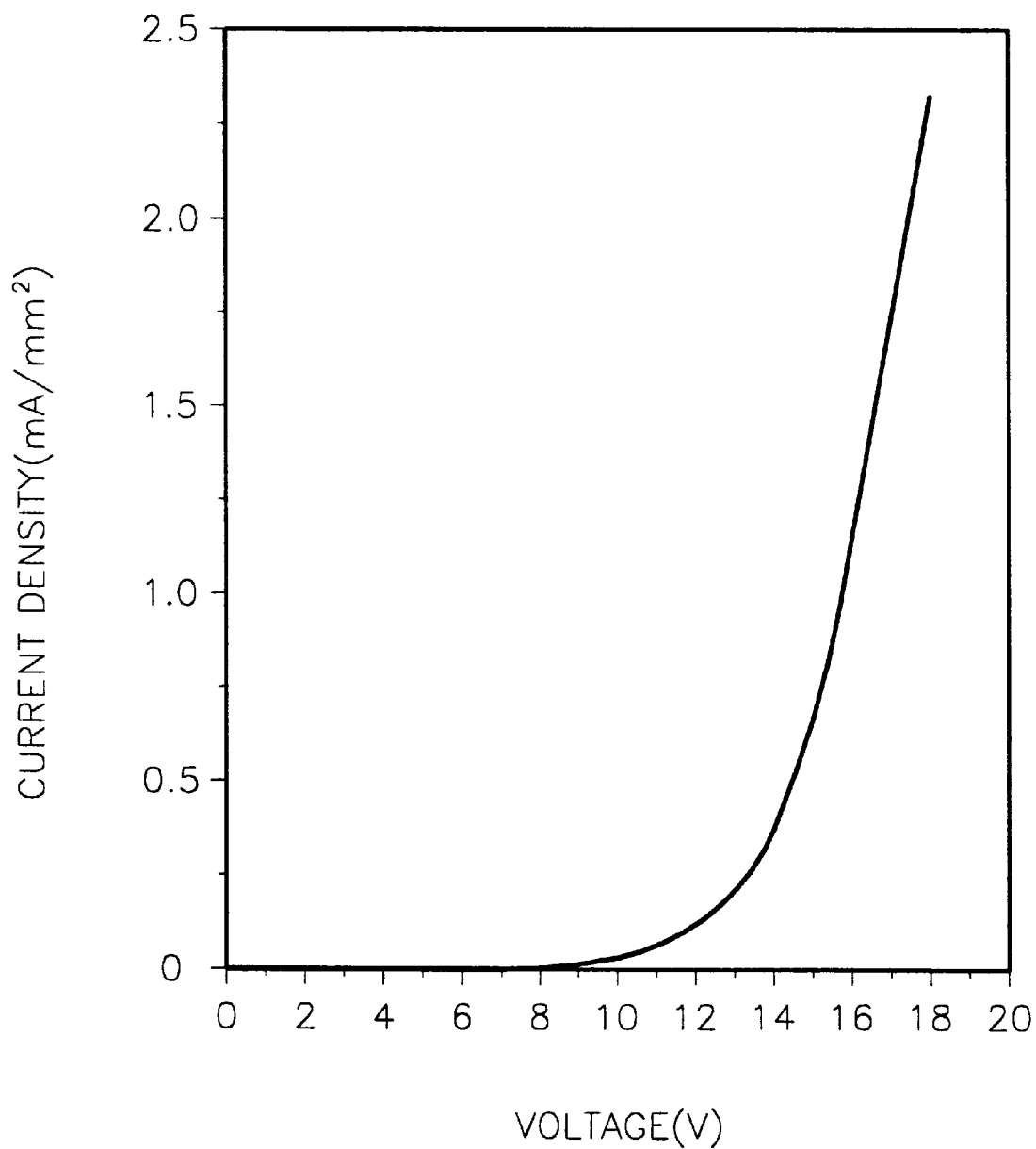
FIG. 3 is a graph showing change in current density according to the intensity of electric field, in an ELD adopting the photoluminescence polymer according to the embodiment of the present invention as a color-developing substance.

As a result, in the ELD of the Example, the maximum absorption peak was shown at 4,500 Å, so that blue could be emitted as shown in FIG. 2. Also, as can be seen from FIG. 3, the driving voltage was 10V.

On the other hand, in the ELD of the Comparative Example, the maximum absorption peak wavelength was 5,500 Å and the driving voltage was 12V.

As described above, the ELD adopting as a color developing substance the photoluminescence polymer according to the Example of the present invention can display various colors including blue, and the driving voltage thereof is equal to or less than that of the conventional ELD. Also, the response time is very short.

The photoluminescence polymer of the present invention can be used as a color developing substance for the display device, and is particularly useful in a device requiring good film forming properties.

Also, a device adopting the photoluminescence polymer according to the present invention has a low driving voltage and a short response time, and can display various colors over the range from blue to green, especially, blue.

What is claimed is:

1. An electro-luminescence display (ELD) comprising:
    a substrate;
    a first electrode layer formed on the substrate;
    an emission layer formed on the first electrode layer; and
    a second electrode layer formed on the emission layer, wherein the emission layer comprises a photoluminescence polymer represented by the following formula (A):

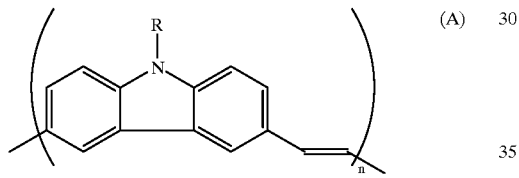

(A)

where R is one selected from the group consisting of an unsubstituted aliphatic hydrocarbon group and an unsubstituted or substituted aromatic hydrocarbon group, and n is an integer between 3 and 260.

2. The ELD of claim 1, wherein the weight average molecular weight of the photoluminescence polymer is about 500 to about 50,000.

3. An electro-luminescence display (ELD) comprising:
    a substrate;
    a first electrode layer formed on the substrate;
    an emission layer formed on the first electrode layer; and
    a second electrode layer formed on the emission layer, wherein the emission layer comprises a photoluminescence polymer represented by the following formula (A):

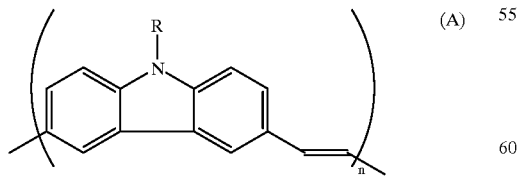

(A)

where R is an unsubstituted aliphatic hydrocarbon group, and n is an integer between 3 and 260.

4. The ELD of claim 3, wherein the weight average molecular weight of the photoluminescence polymer is about 500 to about 50,000.

5. The ELD of claim 1, wherein R is an unsubstituted or substituted aromatic hydrocarbon group.

6. The ELD of claim 5, wherein R is an unsubstituted aromatic hydrocarbon group.

7. An electro-luminescence display (ELD) comprising:
    a substrate;
    a first electrode layer formed on the substrate;
    an emission layer formed on the first electrode layer; and
    a second electrode layer formed on the emission layer, wherein the emission layer comprises a photoluminescence polymer represented by the following formula (A):

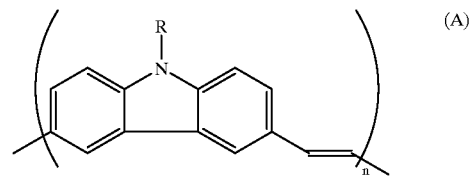

(A)

where R is one selected from the group consisting of linear aliphatic hydrocarbon group and an unsubstituted or substituted aromatic hydrocarbon group, and n is an integer between 3 and 260.

8. The ELD of claim 7, wherein the weight average molecular weight of the photoluminescence polymer is about 500 to about 50,000.

9. An electro-luminescence display (ELD) comprising:
    a substrate;
    a first electrode layer formed on the substrate;
    an emission layer formed on the first electrode layer; and
    a second electrode layer formed on the emission layer, wherein the emission layer comprises a photoluminescence polymer represented by the following formula (A):

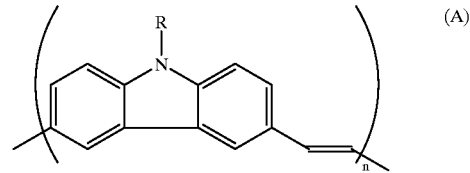

(A)

where R is a linear aliphatic hydrocarbon group, and n is an integer between 3 and 260.

10. The ELD of claim 9, wherein the weight average molecular weight of the photoluminescence polymer is about 500 to about 50,000.

* * * * *